United States Patent [19]

Hoffman

[11] Patent Number: 4,971,407
[45] Date of Patent: Nov. 20, 1990

[54] TWO STAGE RUN AND STRING DATA COMPRESSOR PROVIDING DOUBLY COMPRESSED OUTPUT

[75] Inventor: Philip M. Hoffman, Orland, Pa.

[73] Assignee: Unisys Corp., Blue Bell, Pa.

[21] Appl. No.: 391,074

[22] Filed: Aug. 9, 1989

[51] Int. Cl.$^5$ ............................................ H03M 7/30
[52] U.S. Cl. .......................................... 341/87; 341/95; 341/60; 375/122; 358/426
[58] Field of Search ............ 341/51, 55, 60, 61, 341/87, 95; 358/426; 375/122

[56] References Cited

U.S. PATENT DOCUMENTS

| | | | |
|---|---|---|---|
| 4,464,650 | 8/1984 | Eastman et al. | 341/87 |
| 4,523,276 | 6/1985 | Maejima et al. | 341/95 |
| 4,558,302 | 12/1985 | Welch | 341/51 |
| 4,684,923 | 8/1987 | Koga | 341/87 |
| 4,866,440 | 9/1989 | Tsukiyama et al. | 341/95 |

*Primary Examiner*—William M. Shoop, Jr.
*Attorney, Agent, or Firm*—John B. Sowell; Mark T. Starr; Robert S. Bramsom

[57] ABSTRACT

A data compression/decompression system employs two stages of data compression. Information and/or character data is first formatted into M-bit width digital data characteristics for input to the first stage of the data compression system which comprises an expanding run length encoder having N-bit width output character where $N > M$ and the number of M-bit width characters is greater than the number of N-bit width characters. The output of the expanding run length encoder is applied directly to a compatible adaptive string matching second stage data compression encoder of the type which is not degraded or affected by the input.

When the input data stream to the two stage system is not of a known format or provided with leader or header bit character width information, a bit analyzer and a chopper are provided in a data stream to prepare the data stream in a bit character width format which matches the input of the expanding run length encoder.

23 Claims, 7 Drawing Sheets

FIG. I (PRIOR ART)

TWO STAGE RUN AND STRING DATA COMPRESSOR PROVIDING DOUBLY COMPRESSED OUTPUT

BACKGROUND OF THE INVENTION

1. Field of the Invention

The present invention relates to novel run length encoders and more particularly to a run length encoder for use with a string data compression system to pre-compresses the input data to the string data compression system.

2. Description of the Prior Art

The present invention novel run length encoder is adapted to perform pre-compression of an input data stream being applied to a high speed data compression system of the type described in Welch U.S. Pat. No. 4,558,302 classified in U.S. Class 341, Subclass 51. Further, the present invention is specifically adapted to precompress the input stream of data applied to a universal controller data compression system of the type employed to control tape systems and/or disk systems set forth in co-pending U.S. Application Ser. No. 202,733 filed June 3, 1988 entitled DATA COMPRESSION/DECOMPRESSION APPARATUS WITH THROTTLE, START-UP AND BACKWARD READ CONTROLS classified in U.S. Class 341, Subclass 60.

The aforementioned Welch Data Compression Algorithm and Method was published in the IEEE "COMPUTER" Vol. 17, No. 6, June 1984, at pages 1–19. Shortly after this publication was distributed, engineers and scientists adapted the technique which was placed on several electronic bulletin boards throughout the United States and has since become virtually a standard in the scientific community and is being presently processed by the International Standards Organization (ISO) as a worldwide standard for modems and similar data compression apparatus. The present invention, by being compatible, offers an enhancement to this standard.

The aforementioned Welch data compression system is capable of accepting characters of length (width) from 8 to 11 bits and to maintain an efficient data compression ratio which is not generally true of other data compression systems.

When prior art 9 bit character data streams are fed into 8 bit selective [sometimes mistakenly called adaptive] Huffman data compression systems, the data compression ratio is severally degraded. The degradation may be so severe that the system is not operable over a general range of different types of data. The Huffman data compression system may be characterized as a character distribution system, thus, if the distribution is disrupted by inputting 9 bit characters into an 8 bit data compression system, the selective Huffman data compression system is virtually neutralized and/or destroyed as an efficient system. Selective Huffman data compression systems take account of the frequency of characters in the input data stream and subsequently select one of a plurality of sets of alphabets stored in a memory library to employ for encoding characters. The most frequent occurring characters are encoded in fewer bits that the input character bits and less frequent occurring characters are expansion-encoded into a greater number of bits than the input character bits.

The aforementioned Welch article in "Computer" states that "Run-length encoding—has virtually no value in text, and has moderate value in data files." While this is true as a general case for run length encoders it is NOT true for the present invention specific run length encoder as will be explained in detail hereinafter. Since Welch data compression is rapidly becoming a worldwide standard to be used in modems, fax machines, etc., it would be extremely desirable to provide a universal data compression system that is automatically adaptable to the width of the bit characters in the bit data stream and provides data compression ratio enhancement to the data to be compressed in Welch data compression systems.

SUMMARY OF THE INVENTION

It is a principle object of the present invention to provide a high speed real time double data compression system employing novel expanded run length pre-encoding and subsequent adaptive character string data compression encoding.

It is another principle of object of the present invention to provide a real time data compression system which is operable to process a bit stream having characters of variable width as an input.

It is another object of the present invention to provide a high speed data compression system bit analyzer apparatus for automatically determining the bit character width of characters in a bit data stream.

It is another object of the present invention to provide a novel expanded run length encoder adapted to precompress a data stream before being compressed in an adaptive data compression system.

It is another object of the present invention to provide apparatus for detecting and selecting a channel width equal to the character width of the input data stream and for applying the input to a novel expanded run length encoder.

It is another object of the present invention to provide a system employing enhanced loss less Welch data compression.

It is another object of the present invention to provide a precompression system which enhances the data compression ratio of the Welch data compression system being adapted as an international standard.

It is a general object of the present invention to provide an enhanced data compression and decompression system.

It is another general object of the present invention to provide a novel data compression system which achieves data compression ratios for database information and graphics information at ratios approaching 20:1.

According to these and other objects of the present invention, there is provided a data precompression apparatus for compressing a bit stream of data character signals into a run length compressed stream of coded signals in a format for secondary compression. The input data stream is analyzed and applied to a character width chopper which produces a predetermined character width output which is applied to a novel expanded run length encoder to produce an expanded run length encoded signal in a format and character width for application to a second data compression system preferably of the type described in Welch U.S. Pat. No. 4,558,302 and in Application Ser. No. 202,733 filed June 3, 1988, now U.S. Pat. No. 4,899,147 Feb. 6, 1990.

DESCRIPTION OF THE PREFERRED EMBODIMENT

Before explaining the Figures and the present invention in detail the definition of a standard run length encoder (RLE) needs to be understood.

Standard run length encoders detect repeating identical characters or strings of repeating characters and encode the repeating characters or strings using a run identifier character accompanied by a run count character.

The present invention novel expanded run length encoder combines the aforementioned run identifier character and the run count character into a single character.

The standard run length encoder produces at its output characters of duplicate length as the character being received. In contrast thereto the novel expanded run length encoder encodes characters which occur outside the length of the character bits being received in the data stream and produces at its output characters which are expanded to a predetermined character width.

Figure 1:
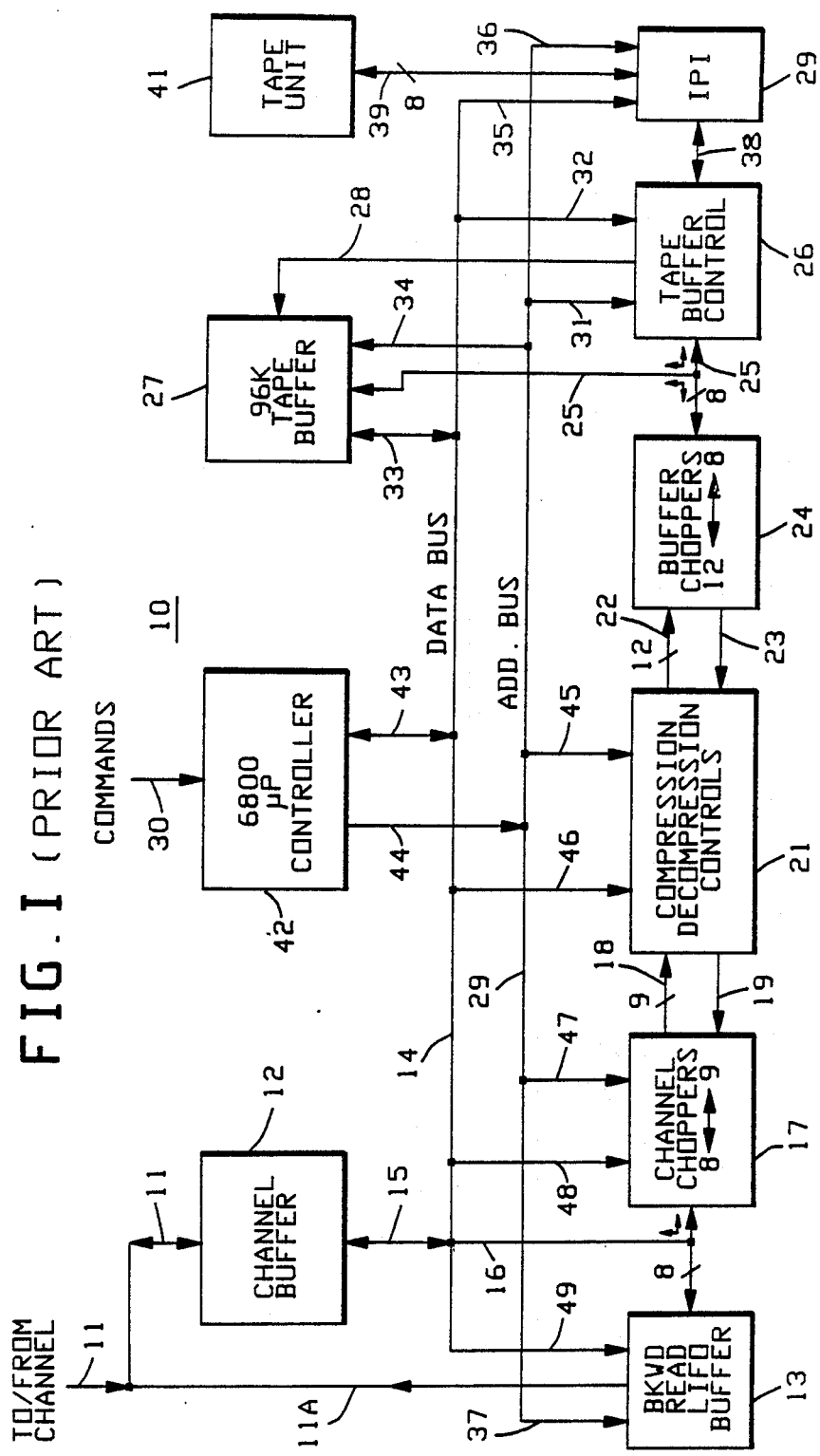
FIG. 1 is a block diagram of a preferred prior art data compression system in which the present invention may be retrofitted to provide a improved double data compression system.

Refer now to FIG. 1 showing a block diagram of a preferred prior art data compression system which employs the aforementioned Welch data compression algorithm. System 10 comprises a parallel bus 11 which connects to the outside world comprising a channel or host computer. Bus 11 has its input connected internally to system 10 through channel buffer 12 and is adapted to receive its major output from system 10 through buffer 12. Bus 11 may receive as a direct output information from backward read last-in-first-out buffer 13 which bypasses buffer 12.

The parallel output from buffer 12 into system 10 is applied to bidirectional data bus 15, 16 which connects to the input of channel choppers 17. Choppers 17 convert the 8 bit input on bus 16 into 9 bit characters on line 18. The 9 bit information on line 18 is applied to a Welch type compression-decompression control system 21 having a bit character width input adapted to receive the widest character from the preceeding choppers 17 in the preferred embodiment of the present invention.

The output from controller 21 on line 22 comprises 12 bit words which are converted in buffer choppers 24 to 8 bit words on bidirectional bus 25 in a compressed format for recording on tape. Bus 25 from choppers 24 connects to tape buffer 27 which serves to collect enough data to permit continuous recording of compressed data. Buffered information in buffer 27 is routed via bidirectional bus 25 to tape buffer control 26 under control of buffer 26 and control line 28.

After delayed accumulation of sufficient compressed information in buffer 27 to permit continuous recording, tape unit 41 may request information to be recorded from the tape buffer control 26 and intelligent peripheral interface (IPI) 29. In response to a request for information, compressed data in applied via bus 25 to control 26 and passes through IPI 29 to tape unit 41 via bidirectional lines 38 and 39. The eight bit byte information in tape unit 41 follows a reverse path back to bus 11 in response to a request for information by the host computer (not shown). The request command is applied at line 30 to processor controller 42 which sends out instructions to all of the elements in system.

System 10 when set in the decompression mode causes tape unit 41 to applies 8 bit byte compressed information to line 39, IPI 29, line 38, controller 26 and via bus 25 to buffer 27.

Tape buffer control 26 again controls tape buffer 27 and causes the accumulated information to be presented on bidirectional bus 25 as an 8 bit byte input to choppers 24. The 12 bit byte information on line 23 is decompressed in controller 21 and presented as 9 bit byte words on output line 19 to channel choppers 17. The 8 bit byte words on bidirectional bus 16, 15 are applied to the input of channel buffer 12. The asynchronous logic in channel buffer 12 assimilates the necessary information for proper format output on bus 11 to the host system.

When the information request command to system 10 is a backward read last-in-first-out command, the aforementioned decompression sequence continues up to providing 8 bit bytes on bus 16 from choppers 17. The information on bus 16 is applied to buffer 13 and stored. Subsequently, the stored information in buffer 13 may be read out backwards via bus 11A on to bus 11 which bypasses buffer 12.

The aforementioned explanation of the compression and decompression of data has been explained with reference to the data paths and was not concerned with with the control paths. However, controller 42 informs the elements of the system 10 which function will be performed via control lines not shown. A data bus 14 and an address bus 29 are provided with lines 31 to 37 and 43 to 49 for receiving initial control information and for setting up the system 10 prior to compressing data received on bus 11.

Figure 2:
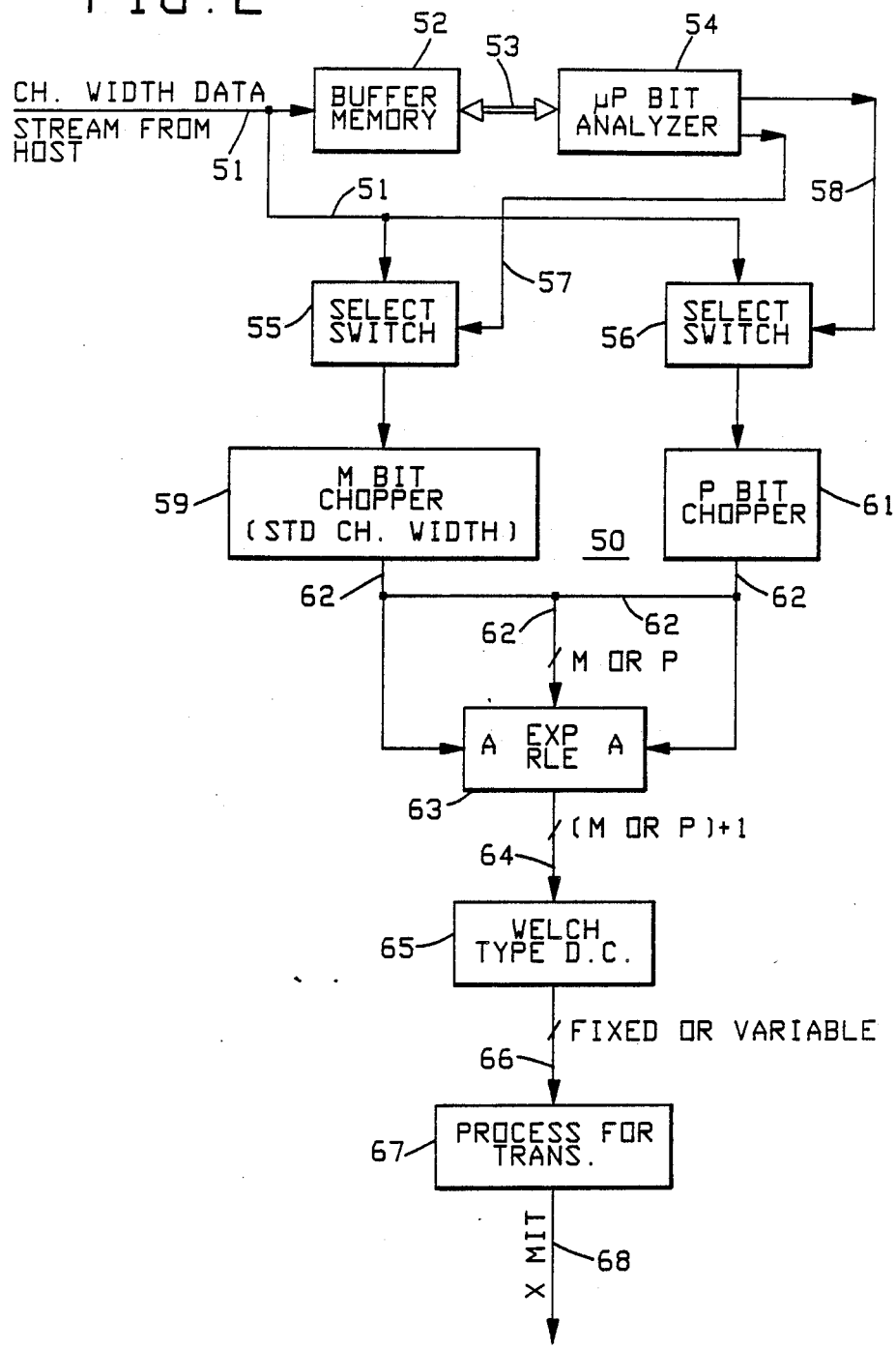
FIG. 2 is a block diagram of the preferred embodiment of the present invention precompression data compression system.

Refer now to FIG. 2 showing a block diagram of the present invention precompression data decompression system 50. A bit data stream having character width data information from a channel or host computer on line 51 is applied to a buffer memory 52 and coupled via bi-directional bus 53 to a microprocessor bit analyzer 54. Information on line 51 is applied to select switches 55 and 56 selectively controlled by lines 57 and 58 from bit analyzer 54. Bit analyzer 54 and select switches 55 and 56 are operable to connect the bit stream on line 51 to the input of the M bit chopper 59 or a P bit chopper 61 which defines the character width of the characters on the bit data stream 51 and will be explained in detail hereinafter. Microprocessor bit analyzer 54 pre-examines a block of information stored in buffer 52 and determines the character width of the data stream so as to select the proper character width chopper 59 or 61 or any desired variable width chopper as will be explained. The output of the selected chopper is applied as an input on line 62 to an expanded run length encoder (RLE) 63 which is shown having a diagrammatic control signal applied to an active or select terminal (A) of the expanded run length encoder 63 which informs the encoder of the width of the character to be encoded. The expanded RLE 63 expands the character received on line 62 to produce an expanded and encoded signal on output line 64 in a proper format for application to a string type data compression system 65. Block 65 is shown to be a Welch type data compression system of the type described in the aforementioned patents, applications and articles describing or employing Welch data compression systems The compressed data from the Welch data compression system 65 on line 66 is applied to a logic block 67 for processing the compressed information for transmission via line 68 to a remote receiver not shown.

The universal data compression system shown in FIG. 2 accommodates a plurality of data streams having characters of different width. When the width of the character in the data stream 51 is known, the bit stream may be applied directly to the selected or dedicated chopper having a predetermined standard channel width. The output may be applied directly to the expanded run length encoder 63 without the necessity of generating selection signals or actuating the selection switches 55 and 56, employing the bit analyzer 54 to determine the width of the characters stored in the buffer memory 52. It will be understood that the expanded run length encoder 63 should be specifically designed for the width of the character being received by the dedicated chopper 59. To achieve the maximum and most effective data compression in the present system. A feature of the Welch data compression system is that it will accept without modification characters of various widths and still achieve optimum data compression of the inputted encoded information on line 64. A further feature of employing Welch data compression is that the width of the information characters on output line 66 may be varied for achieving optimum compression and also optimum transmission speed.

For example, many computer systems employ 8 bit character width. The 8 bit character when applied to input line 62 is expanded in RLE 63 to a 9 bit character as an input to the Welch data compression system 65 and starts as a 9 bit output on line 66 and expands to the maximum character width required which is only limited by the associated memory.

Before explaining the flow diagrams shown in FIGS. 3 to 10 which are employed to explain the mode of operation of the novel expanded run length encoder it will be understood that the logic functions described are performed on information stored in registers The novel encoder 63 may be implemented employing discrete components or performed using a small computer system programmed to carry out the steps of the flow diagram. Three of the eight registers described below are fixed upon initiation and data in remaining five registers referred to are loaded during operation as will be explained.

| Registers | Information |
|---|---|
| Input Character (CH) | Input stream |
| Run Offset Value | Fixed by CH width |
| Residual Byte CH (Flag) | Fixed by CH width |
| Look Back CH | Load before state 1 |
| Run Count | Load in states 1,2 |
| Maximum Run Count [32] | Fixed |
| Run Count plus Run Offset Value | Load in state 2 |
| Maximum Run Count plus Run Offset value | Load in state 2 |

Figure 3:
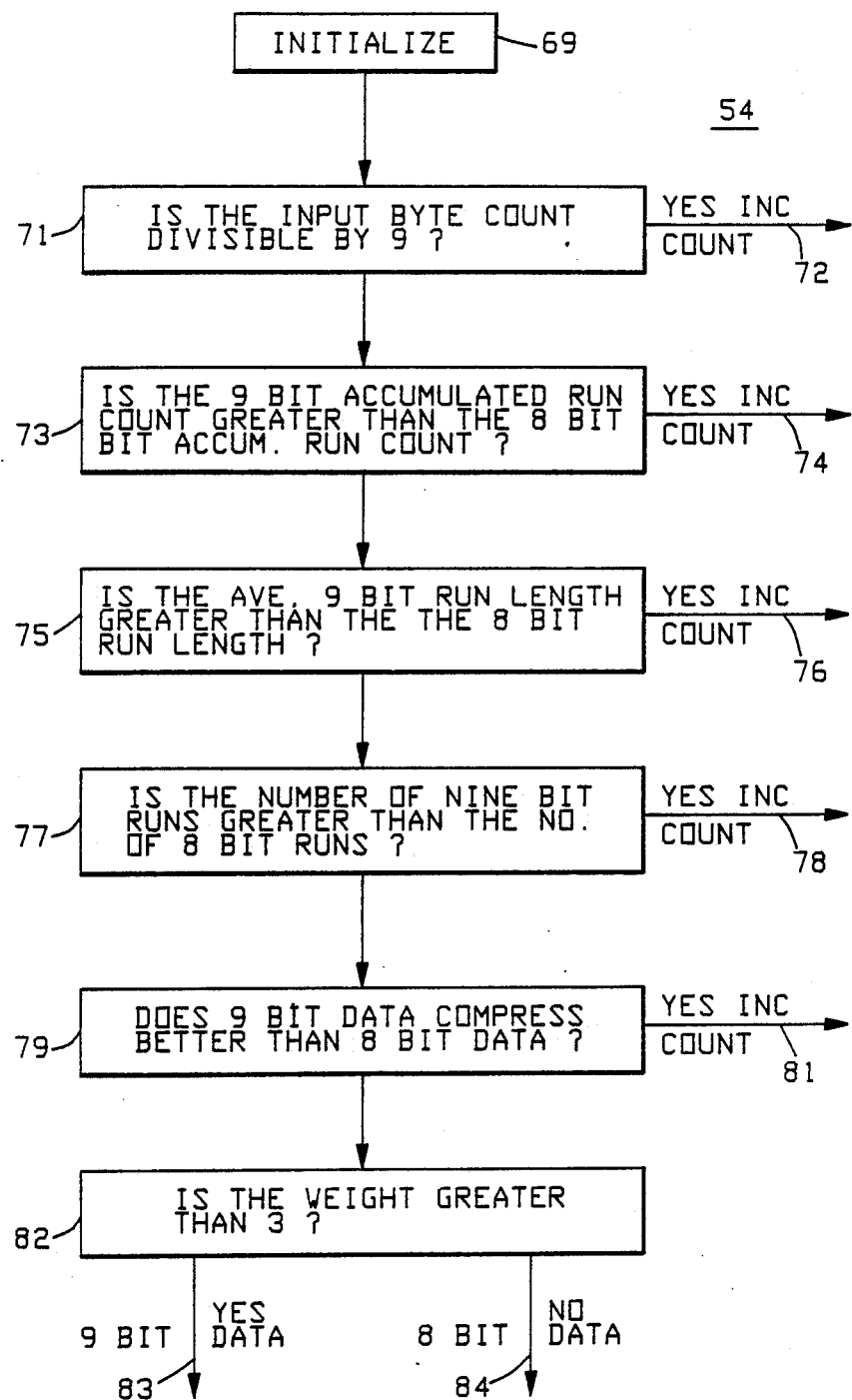
FIG. 3 is a block flow diagram of the preferred character width analysis decisions employed by the bit analyzer of FIG. 2.

Refer now to FIG. 3 showing a block flow diagram of the preferred character width analysis decisions employed by the bit analyzer 54 shown in FIG. 2. Bit analyzer 54 performs an initialization operation at block 69 which gathers sufficient statistical data to perform the following decision operations. Analyzer block 71 determines if the bytes stored in buffer memory 52 are divisible by a character width, such as a 9 bit character used for purposes of illustration. If analyzer block 71 determines that the byte count stored in analyzer 54 is divisible by 9, there is a high probability that the character length or width is a 9 bit character and the statistical counter (not shown) is incremented one count by the signal on line 72. In similar manner the statistical data stored in the bit analyzer 54 is analyzed in analyzer block 73 to determine if the run count for 9 bits is greater than the accumulated run count for other bits such as an 8 bit character. If the accumulated run count shows a high probability that the character length is a 9 bit character, the counter is again incremented by the count on line 74. In similar manner the statistical information is again examined at analyzer block 75 to determine if the average run length for 9 bit characters is greater than the average run length for other characters such as an 8 bit character. If the statistical information shows that the average length of each repeating sequence for 9 bit characters is greater than the average run length for other characters, then the probability exists that the character length in the bit stream is a 9 bit character and the signal on line 76 is employed to index the counter. If the counter (not shown) has an increment count of 3, there is an extremely high probability that the bit stream contains 9 bit characters, however, if additional statistical information is required, further analysis of the information stored in buffer 52 may be conducted. If the count in the counter is zero, there is an extremely high probability that the character in the bit stream is not a 9 bit character. This information may be used to perform decision making without further use of the bit analyzer chart shown in FIG. 3 or additional statistical information may be employed to make the bit character width analysis. In logic block 77 a determination is made if the number of 9 bit runs is greater then the number of 8 bit runs and if so, the signal on line 78 is employed to again increment the counter.

Similarly, the logic block 79 determines if 9 bit characters data compress better than 8 bit character data and if the answer is yes, the counter is incremented by the signal on line 81. Additional statistical information may be generated to determine the length of the character in the bit stream, however, a tally count may be taken by logic block 82 to determine if the counter has been incremented to a count of 3 which denotes a high probability that the data in the bit stream is 9 bit data. In the example shown in FIG. 3, the alternative is 8 bit character width data. The signals on lines 83 and 84 are interpreted by the bit analyzer 54 to generate the aforementioned signals on lines 57 and 58 to select one of the plurality of select switches such as switches 55 and 56 to select the proper channel width chopper employed in the preferred embodiment of the present invention.

Figure 4:
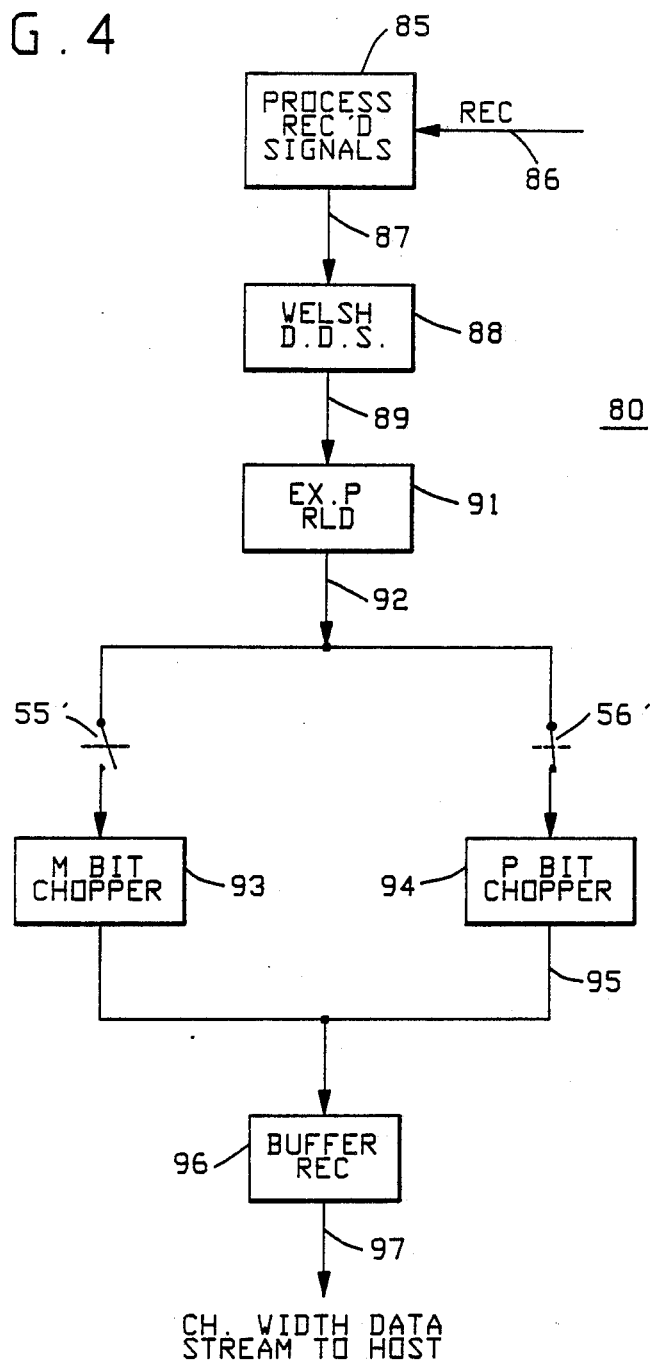
FIG. 4/ is a block diagram of the present invention decoding decompression system.

Refer now to FIG. 4 showing a block diagram of the present invention decoding decompression system. Decompression system 80 comprises processing logic 85 for the signals received on line 86. The processed signals on output line 87 are applied to a Welch type data decompression system 88 or other type string decompression system. The decompressed data on line 89 is applied to a novel expanded run length decoder 91 which produces decoded signals on line 92 having the reverse expansion or contraction ratio of the encoding system. The decoded signals on line 92 are supplied through selector switches 55' and 56' depending on the character width determined by the run length decoder. The decoded information on line 92 is applied to its matching character width bit chopper 93 or 94 to provide the original data bit stream information originally applied to the compressor system of FIG. 2. The decoded data on line 95 is shown being applied to a buffer receiver 96 to produce the channel width data stream which is applied to a host or a channel as described hereinbefore via line 97.

Figure 5:
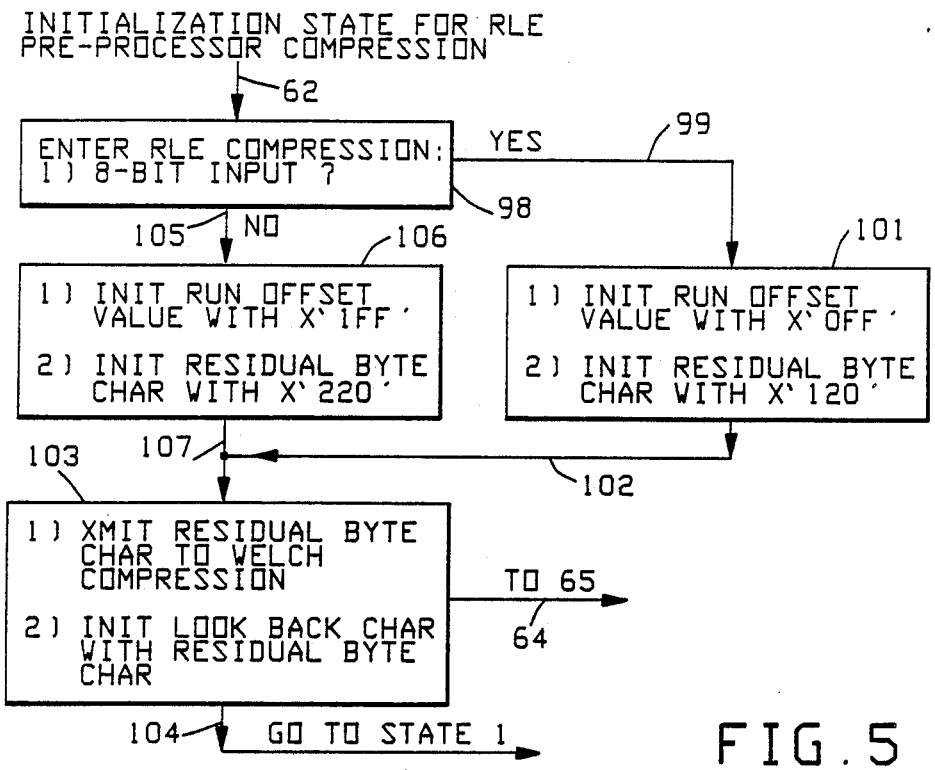
FIG. 5 is a block diagram of the initialization state of a preferred expanded run length encoder.

Refer now to FIG. 5 showing a block diagram of the initialization state of a preferred expanded run length encoder 63. In the initialization state, logic block 98 generates 8 bit or 9 bit RLE characters depending on the select state and a run count. It will be understood that the choppers 59, 61 and encoder 63 in FIG. 2 are character width choppers and encoders. Data line 62 is shown having an input to logic block 98 forming the input of the run length encoder 63. Logic block 98 determines whether the data on line 62 is an 8-bit input or a different character width input. This determination was previously shown at the select line 62 shown in FIG. 2. When an 8-bit input is detected at line 99, the run length encoder 63 initializes a run offset character register value with "zero FF" in hexadecimal shown as X "OFF" in logic block 101. The logic block 101 also initializes the residual byte character register with X "120" in hexadecimal and exits on line 102 as an input to logic block 103. Logic block 103 transmits the residual byte character to the Welsh type data compressor 65 via line 64. Further logic block 103 initializes the look back character register employing the residual byte character previously generated in logic block 101 and then proceeds to go to state one via line 104.

If the decision made in logic block 98 indicates that the input is not an 8 bit input then the decision on line 105 follows into logic block 106 instead of following the logic via line 99. In logic block 106, the run offset value is generated employing the hexadecimal X "1FF" which is followed by the generation of the residual byte character in hexadecimal shown as X "220". Following the generation of these two characters in logic block 106 the logic exits on line 107 which merges into the logic on line 102 as the input to logic block 103 previously explained.

Figure 6:
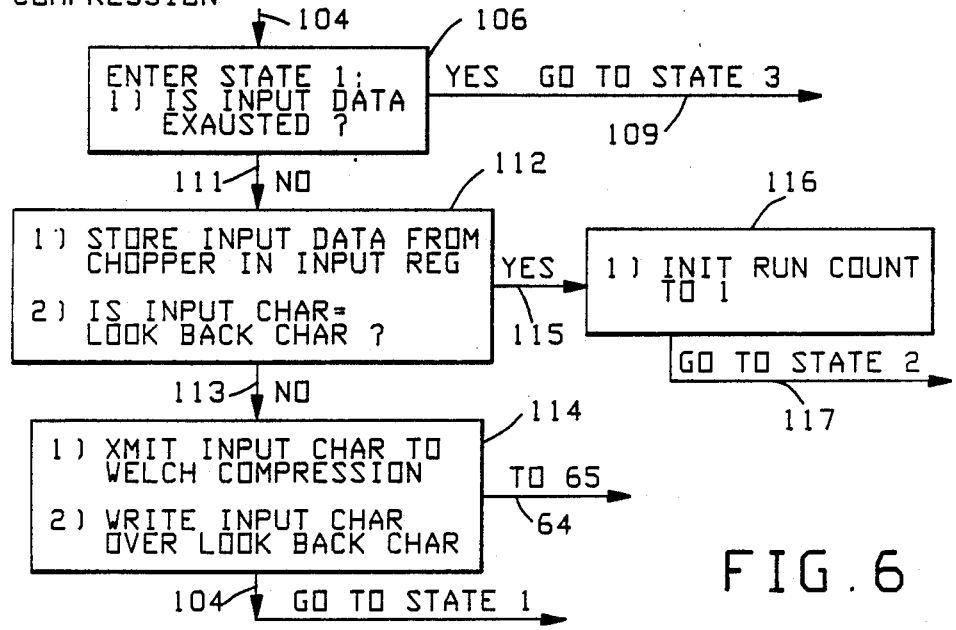
FIGS. 6 to 8 are block diagrams of the three states 1 to 3 employed by the preferred expanded run length encoder of the present invention.

Refer now the FIG. 6 showing a block diagram of the state 1 logic and logic block 108 which determines if the input data is exhausted If the input data is exhausted, the logic goes immediately to state 3 via line 109 but if the data is not exhausted the logic continues via line 111 into logic block 112. Logic block 112 stores the input data from the chopper 93 or 94 in the input character register and then determines if the input character in the input register is equal to the look back character previously generated during the initialization phase in logic block 103. If the input character in the input register is not equal to the look back character, the decision is sensed at line 113 and the logic proceeds to logic block 114. Then the input character in the input register is transmitted to the Welsh data compressor 65 via line 64. The logic block 114 writes the input character in the input register over the look back character in the look back character register and proceeds to state 1 via line 104. If the input character in the input register is equal to the look back character in the look back register, the logic proceeds on line 115 to logic block 116 and initiates the run count to a count of one, then proceeds via line 117 to state 2.

Figure 7:
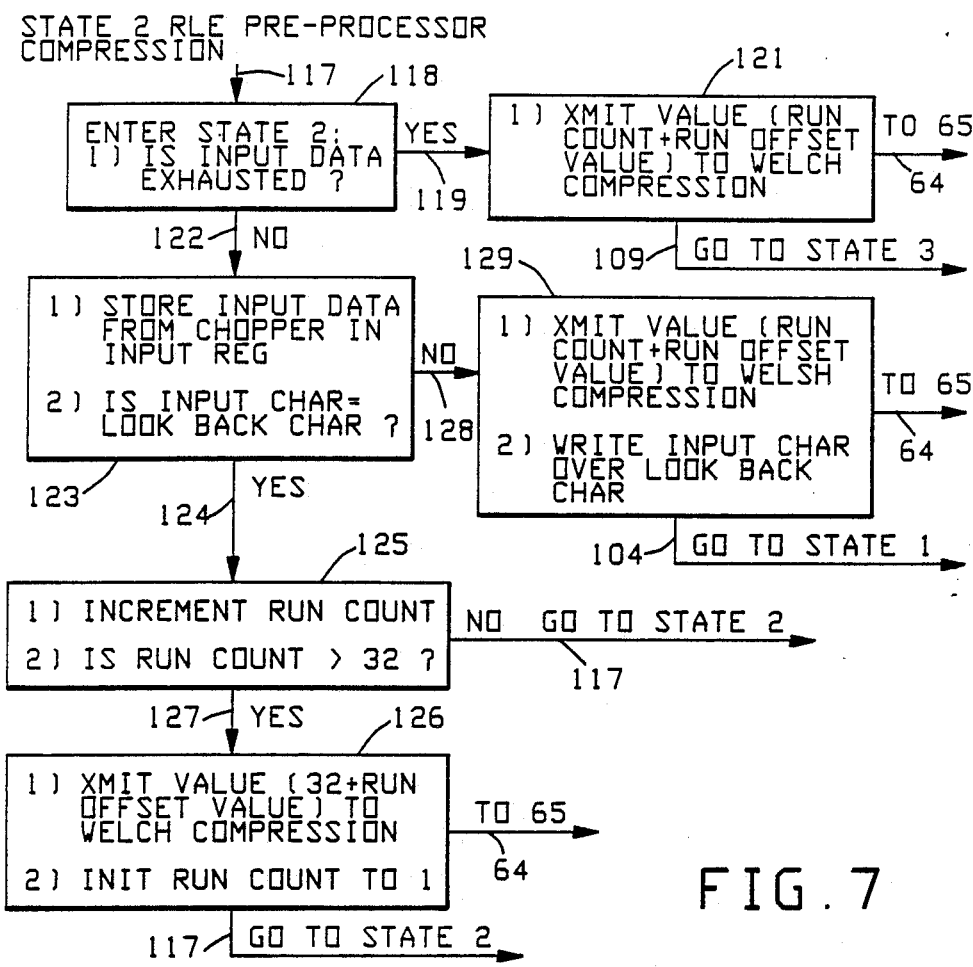

Refer now to FIG. 7 and state 2 showing a block diagram of the state 2 logic and logic block 118 which determines if the input data is exhausted. If the input data is exhausted a decision on line 119 causes the logic the enter logic block 121 and to transmit a value equal to the run count plus the run offset value to the Welsh data compressor 65 via line 64. The run count was generated at logic block 116 of FIG. 6 and the run offset value was generated at logic blocks 101 to 106 of FIG. 5. After transmitting the run count plus run offset value to the Welsh Data Compressor 65 the logic proceeds to state 3 via line 109. If the data input was not exhausted as shown in logic block 118 then the logic exits via line 122 to logic block 123 where the input data from the chopper is stored in the input register. Then the input character in the input register is compared with the look back character in the look back register and if they are equal, the logic exits via line 124 to logic block 125. Logic block 125 increments the run count by 1 and determines if the run count is now greater than count 32. If the run count is greater than 32, the logic enters logic block 126 via line 127 and a value equal to 32 plus the run offset value is transmitted to the Welsh Data Compressor 65 via line 64. Then the run count is reinitiated back to the count of 1 and the logic proceeds to state 2 via line 117. If the logic in block 123 determines that the input character is not equal to the look back character, the logic exits via line 128 to logic block 129. The logic in block 129 transmits a value equal to the run count plus the run offset value to the Welsh Data Compressor 65 via line 64 and then writes the input character in the input character register over the look back character in the look back character register and exits via line 104 to state 1. If the determination in logic block 125 had determined that the run count was less than or equal to 32, then the logic would have exited via line 117 to state 2.

Figure 8:
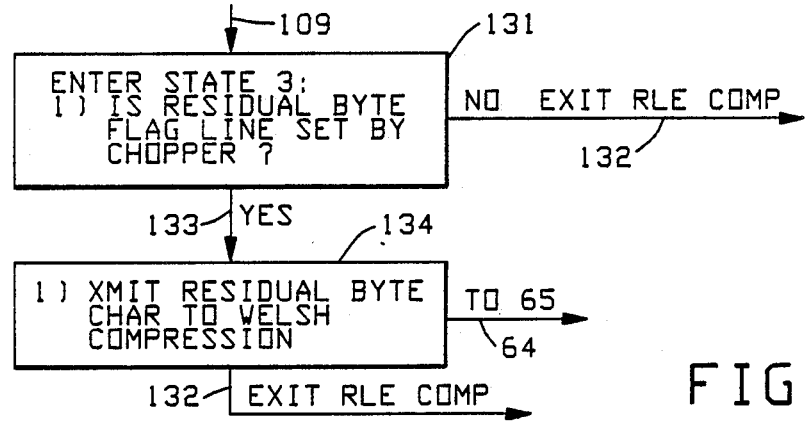

Refer now to FIG. 8 showing a block diagram of the state 3 logic. State 3 is entered via line 109 at logic block 131 which determines if the residual byte flag line has been set by the chopper. This determination was made in FIG. 2 where the byte flag was raised on line 62. If the residual byte flag line has not been set by the chopper the logic exits via line 132 indicating that the sequence of RLE compression has been completed. If the residual byte flag was set by the chopper, the logic exits via line 133 to logic block 134 where the residual byte character in the residual byte register is transmitted to the Welsh Data Compressor 65 via line 64 and then proceeds to raise a signal indication that the process of data compression is complete via line 132. The above described initialization state and 3 logic states completes the RLE compression of data being transferred to a utalization devise or a memory storage device. The compressed data may be retrieved in compressed form and decompressed as follows.

Figure 9:
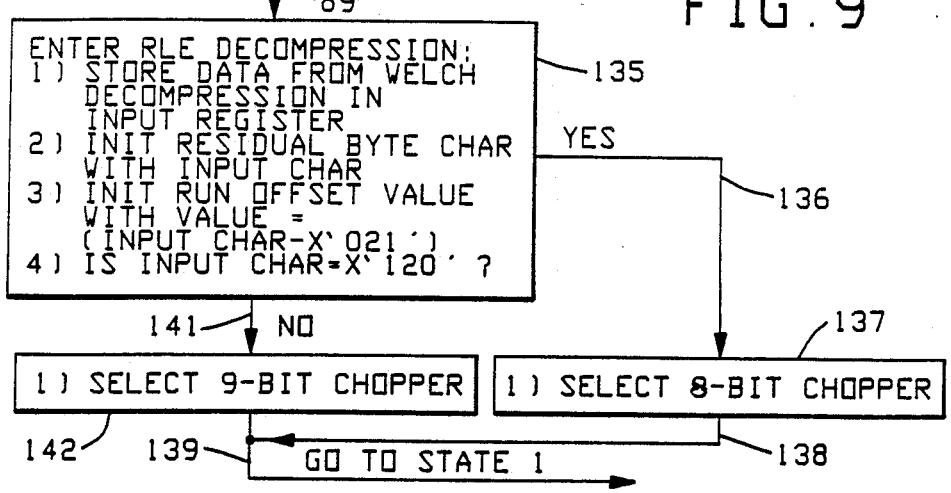
FIG. 9/is a block diagram of the initialization state of a preferred expanded run length decoder.

Refer now to FIG. 9 showing the initialization state for run length encoding post-processor decompresion. The data on line 89 from the Welsh Data Decompressor 88 enters logic block 135 and sequentially completes the four steps shown. The input data from the Welsh Decompressor 89 is stored in the input register in the run length encoder 91. Then the input character in the input register is employed to initiate the residual byte character in the decompressor. The run offset character register is initiated with the value of the input character minus the value 33 shown in hexadecimal as X "021". A determination is then made whether the input character in the input register is equal to the value 288 shown in hexadecimal as X "120". If the values are equal, the logic exits on line 136 to logic block 137 where the 8 bit chopper is selected. The logic proceeds via line 138 to state of the decompressor sequence shown as line 139. If the logic in block 135 had determined that the input character was not equal to the value 288 the logic proceeds via line 141 to logic block 142 where the 9 bit (P bit) chopper is selected and the logic then exits to state 1 of the decompressor via line 139.

Figure 10:
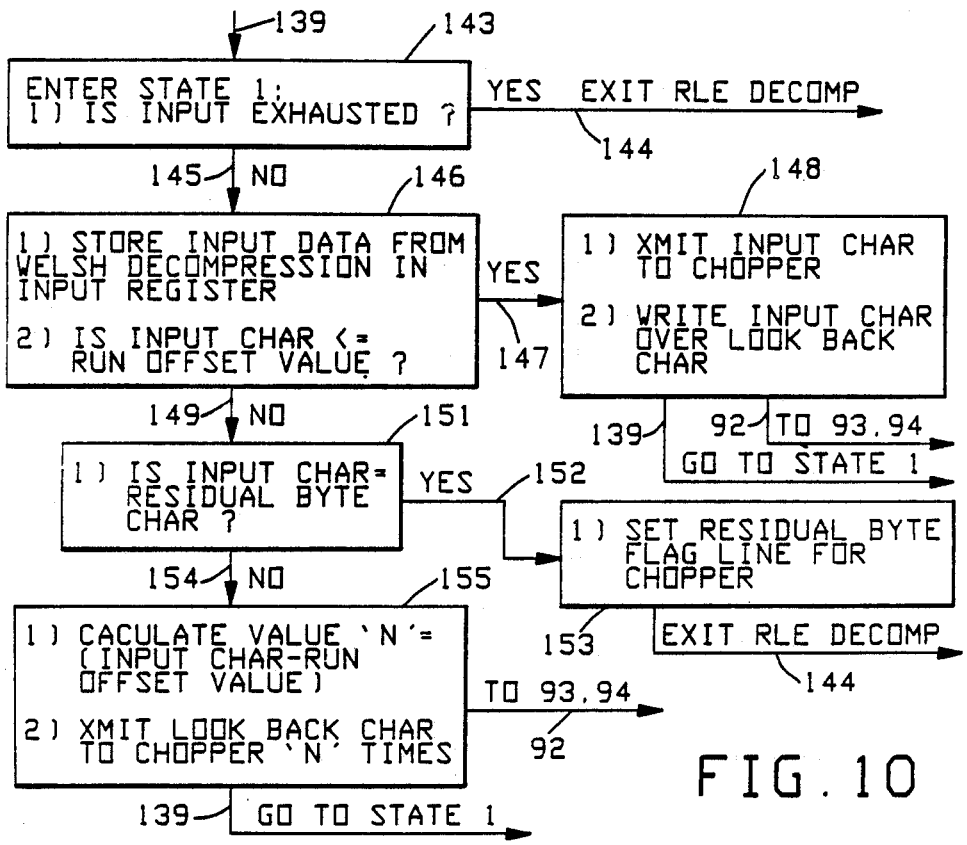
FIG. 10 is a block diagram of the state 1 (and only state) of the preferred expanded run length decoder of the present invention.

Refer now to FIG. 10 showing the logic for state 1 of the decompressor. State 1 is entered via line 139 into logic block 143 where a determination is made if the input data is exhausted If the input data is exhausted the task of the run length encoding decompressor is completed and the logic exits via line 144, however, if the imput data is not exhausted, the logic continues via line 145 into logic block 146. The input data from the Welsh Decompressor is stored in the input register of the decompressor Then a determination is made is the input character in the input register is equal to or less than the run offset value previously generated at logic block 135 of FIG. 9. If the determination is positive, the logic exits via line 147 into logic block 148 where the input character in the input . registser is transmitted to the selected chopper 93 or 94 via line 92. Then the input character in the input register is written over the character in the look back character register and the logic proceeds to state 1 of the decompression logic via line 139. If the logic in block 146 had determined that the input character was not equal to or less than the run offset value then the logic exits via line 149 to logic block 151 where the input character in the input character register is compared with the residiual byte character in the residual byte register. If the values are equal the logic exits via line 152 to logic block 153 where the residual byte flag signal is set on raised on line 90 of FIG. 4 and the logic exits via line 144 indicating that the operation of decompression is complete. However, if the input character was not equal to the residual byte character the logic in block 151 exits via line 154 into logic block 155. Logic block 155 first calculates a value "N" which is equal to the input character minus the run offset value. This value N is used subsequently to transmit the look back character to the selected chopper 93 or 94 N number of times via line 92 Following the transmission of the look back character, the logic proceeds back to state 1 via line 139. The above described proceedure is repeated until the logic in logic block 143 exits on line 144 indicating that the operation of decompression has been completed. It will be noted that the logic in block 153 can exit directly via line 144 indicating completion of the decompression operation. The logic in block 153 could have returned to state 1 where the decision would have been made to exit on line 144.

Having explained a preferred embodiment double data compression system employing expanded run length encoding for precompression before entering an adaptive string data compression system it will be understood that the adaptive string data compression system which is preferred is the Welch system which permits variable character width input and output. Thus, it is possible to manufacture enhanced Welch data compression equipment and/or to retrofit existing Welch data compression equipment by incorporating the novel precompression data compression system explained hereinbefore. Since the Welch compression and decompression system is becoming a worldwide standard for modems used for data transmission and receiving, it will be appreciated that the standard may be so flexible as to permit use of a preferred standard character width chopper which eliminates bit analyzer apparatus and switch selection apparatus described hereinbefore with respect to FIG. 2.

Variable width choppers may be used wherever a variable character width or character length data stream is encountered. The present invention may be further enhanced if the standard now before the ISO embodies therein a requirement for coding data in the bit data stream which identifies the character width of the data stream which follows so that the proper character width chopper may be selected without analysis of the data stream. When this information is available, all of the structure from the data stream 51 to the input line 62 of the expanded run length encoder may be eliminated.

Another important feature of the present invention is that the expanded RLE 63 and the Welch type data compressor decompressor 65 shown in FIG. 2 need not be modified as long as they are constructed to accept the widest character of the variable character widths to be encountered. Then the only requirement necessary is that the input chopper 59 be a character width chopper and that the N bit chopper 93 in the decompressor also be a character width chopper at the output of the expanded RLE 91.

Since the key to providing virtually unlimited flexibility in compressing and decompressing characters of variable width resides in the input and output N bit choppers, it is now apparent that a modular N bit chopper may be constructed which is programmable to perform as an N bit chopper where N is automatically sensed or can be selected from a keyboard or switch. The mode of operation of the preferred embodiment N bit chopper may be implemented by counting the bits in the data stream and selecting the predetermined number of bits with a real time counter.

To more clearly show the outstanding advantages that are achieved by the present enhanced data compression system, the applicant has prepared four tables of different types of information which have been compressed by four typical types of systems including the enhanced Welch data compression system of the present invention. In Table I which follows, examples 1 and 2 represents typical data base information from a commercial data base and from a transaction data base and should compare favorably with data compression of graphics information. A typical data compression system employed by Fujitsu produces a data compression ratio of 12.49 for a commercial data base and a ration of 6.15 for a transaction data base respectively. The same information was compressed by standard run length encoding (RLE) to produce data compression ratios of 11.73 and 4.66 respectively where the data compression for the transaction data base was simulated and estimated. The data compression ratios achievable by a typical Unisys Welch data compression system of the type shown and described in Application Ser. No. 202,733 produced data compression ratios of 8.58 and 6.26 for the commercial data base information and the transaction data base information respectively. When the present invention enhanced Welch data compression was applied to the commercial data base information a data compression ratio of 26.74 was produced and a data compression ratio of 11.05 was produced for the transaction data base information. Example 1 clearly show that the present invention is particularly useful for data base type information. The present invention would be useful for source code and graphics as well. The example 1 information was generated using 9 bit channel or character width data.

Example 3 was run on object code having large bit blocks of information employing 9 bit character width data. The compression ratios achieved for four different systems are enumerated and do not require additional information.

Example 4 was run on 140 megabytes of system backup data in 8,000 byte blocks. This type of information is almost as difficult to compress as object code and illustrates data compression on widely diverse examples of data.

Example 5 was run on approximately 40 megabytes of programmed symbolics in 15,100 bit blocks. This data was in 8 bit character width form, all other examples were in 9 bit character width form. The data show the advantages of the present invention over typical commercially available data compression systems.

TABLE 1

|  | 9 Bit Typical DC | 9 Bit STD RLE | 9 Bit TYP Welch | 8-9 Bit P. Inv. 2XDC |
|---|---|---|---|---|
| EXAMPLE 1 | 12.49 | 11.73 | 8.58 | 26.74 |
| EXAMPLE 2 | 6.15 | 4.66 | 6.26 | 11.05 |
| EXAMPLE 3 | 1.64 | 1.20 | 2.24 | 2.45 |
| EXAMPLE 4 | 2.48 | 1.89 | 2.98 | 3.75 |
| EXAMPLE 5 | *2.53 | *2.01 | *3.61 | *4.41 |

*8 BIT DATA

TABLE 2

|  | 8 Bit TYP Welch | 9 Bit TYP Welch | 8-9 Bit P. Inv. 2XDC |
|---|---|---|---|
| EX 6 (8 bit data) | 2.337 | 1.615 | 2.765 |
| Ex 7 (9 bit data) | 2.109 | 2.866 | 3.321 |
| Ex 8 (Composite data) | 2.270 | 2.066 | 3.018 |

The aforementioned Table 1 examples were run on compatible data compressors having matched width characters. As further examples, the present invention is capable of running mismatched character width data. Table 2, Example 6 shows that when 8 bit input data is run through an 8 bit Welch data compressor, a compression ratio of 2.337 to 1 is achieved but when the same 8 bit input data is run through a 9 bit Welch data compressor the data compression ratio falls to 1.615 to 1 as shown in example 6. However, the present invention data compression system when receiving 8 bit input data automatically analyzes the input data and matches the input data to the preferred embodiment data compression system and achieves a data compression ratio of 2.765 to 1, as shown in example 6, thus, exceeding the data compression ratio for Welch data compression alone.

In example 7 the 9 bit input data was applied to a 8 bit standard RLE data compression system and a data compression ratio of 2.109 to 1 was achieved. When matched to a 9 bit Welch data compression system and a data compression ratio of 2.866 to 1 was achieved. In contrast thereto, the present invention enhanced data compression system produced an enhanced data compression ratio of 3.321 to 1.

In example 8, the composite data used to produce the data was in the form of both 8 bit and 9 bit input data, the compression ratio for an 8 bit Welch data compression system produces 2.270 to 1 data compression ratio. In the 9 bit Welch data compression system a data compression ratio of 2.066 to 1 was achieved. However, when the same composite 8 and 9 bit input data was applied to the enhanced Welch data compression system of the present invention, a data compression ratio of 3.018 to 1 was achieved, thus clearly illustrating that compression ratios of large blocks of composite data of the type usually encountered in computing systems are enhanced by the present invention.

TABLE 3

| (1) Normal RLE (single character look back) | | | |
|---|---|---|---|
| Native character set | OO-FF | | |
| RLE identifier | FD | ($\theta$) | |
| (2) Welch character set | | | |
| input characters | 000-OFF | | |
| Welch control characters | 100-103 | | |
| String characters | 104-FFF | 3836 strings | |
| (3) input | A B A A A A C | $\theta$ B  C C C C C | |
| (4) output | A B A $\theta$ 3   C | $\theta$ $\theta$ B C $\theta$ 4 | |

TABLE 4

| Expanded RLE (single character look back) | | |
|---|---|---|
| (1) Native character set | OO-FF | |
| Expanded RLE characters | 100-11F (repeat 1 . . . 32 times) | |
| Residual byte character | 120 | |
| (2) Welch character set | | |
| input characters | OOO-120 | |
| Welch control characters | 121-123 | |
| String characters | 124-FFF | 3804 strings |
| (3) input | A B A A  A A C $\theta$ | B C C C C C |
| (4) output | A B A $\Delta$3 | C $\theta'$  B C $\Delta$4 |

Refer now to Table 3 showing at paragraph 1 standard run length encoding (RLE) employing single character look back. In this example the native character set ranges from OO to FF in hexadecimal indicating 256 input characters. The RLE identifier requires a single identifier which is selected as a high hexadecimal character shown as FD, also parenthetically indicated by the Greek letter Theta for purposes of illustration to be used hereinafter.

At paragraph 2 of Table 3, the Welch character set is shown requiring 256 input characters ranging from OOO to OFF in hexadecimal. Provision is made for 3836 string characters, 104 to FFF in hexadecimal. The string characters for a typical input stream of characters are shown in Table 3 at Paragraph 3 comprising 14 input characters arbitrarily shown as Aa, Bs, Cs and one Theta.

Paragraph 4 shows the output stream from a standard run length encoder (RLE) wherein the first series of characters to repeat is the character A. The three As are illustrated by θ 3 meaning that the the next 3 characters repeat the preceding A character three times. Similarly, the 5 C characters at the end of the output stream are represented by C θ 4. If the run length identifier θ appears in the input data stream as it appears at the 8th character position it must be repeated as is in the output stream in a standard run length encoder (RLE) in order to indicate that it is an RLE identifier as distinguished from a character. Thus, θθ appears for a θ in paragraph 4. All of the above characters are in hexadecimal notation.

Refer now to Table 4 illustrating the present invention expanded run length encoder employing single character look back as in Table 3. The 256 active character sets are the same as the normal RLE employing OO-FF hexadecimal for the character set. The expanded run length encoder characters now extend from 100 to 11F hexadecimal indicating that the previous character may be repeated 1 to 32 times. As an example, if the character OO is followed by 11F, it indicates that the O character is repeated 32 times. Refer to Paragraph 2 showing that the Welch character set now has input characters from OOO to 120 hexadecimal indicating 289 input characters. Further, the string characters extend from 124 to FFF hexadecimal indicating 3,804 string characters. It should be noted that there is a loss of 32 string characters compared to the Welch character set in Table 3, representing a minor loss of around 1%. The enhancement achieved by the expanded run length encoding is best illustrated at paragraph 4. The input at Paragraph 3 of Table 4 is identical to the input character stream shown in Table 3 having 14 characters. The expanded RLE output characters shown at Paragraph 4 of Table 4 require only 9 characters instead of the 12 characters shown in Paragraph 4 of Table 3. This enhanced precompression in the novel expanded run length encoder is achieved even though the characters are expanded from 8 bits to 9 bits at the input of the Welch data compression system. The present invention Welch data compression system is insensitive to the width of the character in the preferred embodiment. This is accomplished by making the Welch data compression system wide enough at the parallel input to accommodate the widest character width to be encountered.

Even though the expanded run length encoder expands the character width from 8 bits to 9 bits, it stills achieves a substantial data compression in that the run counts are combined with the offsets in the form a single hexidecimal character representation of Δ3, Δ4 etc. Further, the degenerative case of a double RLE identifier θ is avoided by employing new hexadecimal characters θ'. In the example shown in Table 4, the novel expanded run length encoder loses 32 Welch character strings which has little or no effect on the performance of the double data compression system because the Welch string table in memory is seldom utilized to capacity.

The present invention expanded run length encoder is uniquely adapted to compress all forms of information that can be presented in digital form whether or not it was derived from printer files, text, data files or graphics data. While the novel expanded run length encoding system may be used alone, it is more useful in a universal data compression system of a compatible type which further compresses the characters generated at the output of the expanded run length encoder. Two examples will suffice to illustrate this pointer. Graphics data in black and white format is predominantly black lines on white background. When such graphics data is raster scanned, and reduced to characters representative of linear portions, there are numerous adjacent redundant characters. The identical characters are compressed or reduced into single characters, then further compressed in the second data compression system.

Picture graphic data while not merely black or white has numerous adjacent linear portions having the same gray tone. These numerous adjacent redundant portions result in redundant characters which are compressed into single characters before being further compressed in the second data compression system.

As explained hereinbefore the present invention expanded run length encoder is particularly suited for use with Welch data compression systems as the second data compression system (or similar adaptive encoders) The combination of the dual data compression systems tend to optimize the overall performance and provides the best of both worlds in one universal dual data compression system.

WHAT IS CLAIMED IS:

1. Apparatus for pre-compressing a stream of data characters in digital format to provide a stream of run length type data characters in a format which permits secondary data compression, comprising:
    input means for presenting each data character in said stream of data characters in character width format,
    chopper means coupled to said input means for isolating individual M-bit width characters from said stream of data characters,
    expanding run length encoding means coupled to said chopper means for producing N-bit width output characters from said M-bit width input characters where N is greater than M, and
    the number of N-bit width output characters being less than the number of M-bit input characters, thus providing expanded length encoding and fewer number of data characters in said output data stream than in the input data stream.

2. Apparatus as set forth in claim 1 which further includes:
    second data compression means coupled to said expanding run length encoding means for performing double data compression by matching strings of said precompressed N-bit width characters.

3. Apparatus as set forth in claim 2 wherein said chopper means comprises means for adjusting said chopper means to a one of a plurality of predetermined chopper input widths.

4. Apparatus as set forth in claim 3 wherein said plurality of chopper widths include a plurality greater than two.

5. Apparatus as set forth in claim 2 wherein the character width output from said expanded run length encoder means matches the input to said second data compression means.

6. Data pre-compression apparatus for compressing a bit stream of data character signals into a run length compressed stream of coded signals in a format for secondary compression, the apparatus comprising:
    character width chopper means coupled to said bit stream of data characters for selecting M bits from said bit stream,
    first compression means for performing expanded run-length encoding of said M bits of data to provide run length pre-compressed N bit encoded data, and second compression means for performing data compression by matching strings of said pre-compressed data to provide twice compressed data having a compression ratio greater than the data compression ratio of either said first or said second compression means.

7. Apparatus as set forth in claim 6 wherein said chopper means comprises an M bit chopper and a P bit chopper.

8. Apparatus as set forth in claim 7 wherein said M bit chopper comprises an eight bit chopper.

9. Apparatus as set forth in claim 8 wherein said P bit chopper comprises a nine bit chopper.

10. Apparatus as set forth in claim 7 which further includes memory buffer means coupled to said input bit stream for accumulating a bit stream of data, and analyzer means coupled to said buffer means for determining the character bit length of data in said data stream.

11. Apparatus as set forth in claim 10 which further includes selection switch means for selecting one of said choppers for said input bit stream depending on the determined width of the character.

12. Apparatus as set forth in claim 11 wherein said selected chopper and said M bit character width are equal in bit orientation and bit width.

13. Apparatus as set forth in claim 10 wherein said analyzer means comprises microprocessor means for determining a bit byte count of the bit stream stored in said buffer memory means.

14. Apparatus for pre-compressing a stream of data in digital format to provide a stream of run length type data characters in a format which permits secondary data compression, comprising:

input means for presenting data characters in said stream of data into predetermined character width format, means for sensing the character width format in said stream of data characters, and expanding run length data compressing encoding means coupled to said input means for producing N-bit width output characters whose width is greater than the width of the input characters.

15. Apparatus for pre-compressing data as set forth in claim 14 wherein the N-bit width output characters are one bit wider than the width of the input characters.

16. Apparatus for pre-compressing data as set forth in claim 14 which further includes:

second data compression means coupled to said expanding run length data compressing encoding means for providing a twice compressed stream of data.

17. A method for enhancing data compression ratios of loss less data compression systems comprising the steps of:

providing a stream of characters to be compressed which are identifiable as characters in a predetermined native character set, compressing said native character stream of characters by substituting predetermined expanded run length characters for strings of identical native characters to provide a pre-compressed stream of mixed native and expanded run length characters, and compressing said pre-compressed stream of mixed native and expanded run length characters in an adaptive loss less data compression system that is not affected by first compressing said native character stream, thus providing a twice compressed character stream whose data compression ratio of the native character stream is greater than the data compression ratio of the adaptive loss less data compression system alone.

18. A method for enhancing data compression ratios as set forth in claim 17 wherein said expanded run length characters include run length identifier characters indicative of matching character look back 19. A method for enhancing data compression ratios as set forth in claim 17, wherein said expanded run length identifier characters include a separate and distinct expanded run length character for identifying an identifier so as to avoid repetition of identifiers in a data stream.

20. A method for enhancing data compression ratios as set forth in claim 17 wherein said expanded run length characters are greater in number than the character set for standard run length encoding.

21. A method for enhancing data compression ratios as set forth in claim 17 wherein said expanded run length characters combine an identifier with a run count to indicate the number of repetitions of the look back character.

22. A method for enhancing data compression ratios as set forth in claim 21 wherein said expanded run length characters with combined identifiers and run counts equal 2 in number.

23. A method for enhancing data compression ratios as set forth in claim 22 where n is equal to or greater than 5.

* * * * *